United States Patent
Yoo

(10) Patent No.: US 9,421,998 B2
(45) Date of Patent: Aug. 23, 2016

(54) METHOD AND APPARATUS FOR DETECTING MOTOR ERROR OF MOTOR DRIVEN POWER STEERING

(71) Applicant: HYUNDAI MOBIS CO., LTD., Seoul (KR)

(72) Inventor: Ji Hoon Yoo, Yongin-si (KR)

(73) Assignee: HYUNDAI MOBIS CO., LTD., Seoul (KR)

(*) Notice: Subject to any disclaimer, the term of this patent is extended or adjusted under 35 U.S.C. 154(b) by 23 days.

(21) Appl. No.: 14/321,547

(22) Filed: Jul. 1, 2014

(65) Prior Publication Data

US 2015/0151785 A1  Jun. 4, 2015

(30) Foreign Application Priority Data

Nov. 29, 2013 (KR) .................. 10-2013-0147161

(51) Int. Cl.
*B62D 5/04* (2006.01)
*G01R 19/00* (2006.01)

(52) U.S. Cl.
CPC ............. *B62D 5/0487* (2013.01); *B62D 5/046* (2013.01); *G01R 19/0092* (2013.01)

(58) Field of Classification Search
CPC . B62D 5/046; B62D 5/0487; H02P 21/0096; B60W 20/20; B60F 3/0007
USPC ........... 701/41, 42; 180/446; 318/434; 440/6
See application file for complete search history.

(56) References Cited

U.S. PATENT DOCUMENTS

| | | | | |
|---|---|---|---|---|
| 8,884,567 B2* | 11/2014 | Senkou | ............... | H02P 21/0096 318/434 |
| 2009/0132126 A1* | 5/2009 | Tamaizumi | .......... | B62D 5/0487 701/42 |
| 2009/0186535 A1* | 7/2009 | Sullivan | ................ | B60F 3/0007 440/6 |
| 2013/0334997 A1* | 12/2013 | McGrogan | ............. | B60K 6/445 318/434 |
| 2014/0054103 A1* | 2/2014 | Kezobo | ................ | B62D 5/0487 180/446 |

FOREIGN PATENT DOCUMENTS

KR    10-2012-0033171 A    4/2012

* cited by examiner

*Primary Examiner* — Yuri Kan
(74) *Attorney, Agent, or Firm* — Knobbe Martens Olson & Bear LLP

(57) ABSTRACT

A method for detecting a motor error of a motor driven power steering (MDPS) may include: calculating, by a control unit, a Q-axis command current of a motor through a Q-axis command current calculation unit, according to requested torque; calculating a command current of each phase of the motor from the calculated Q-axis command current of the motor; controlling the motor according to the Q-axis command current of the motor, and sensing a measured current of each phase of the motor through each current sensor; determining whether each phase of the motor is disconnected, through the command current and the measured current of each phase of the motor; and outputting the determination result to an output unit.

7 Claims, 6 Drawing Sheets

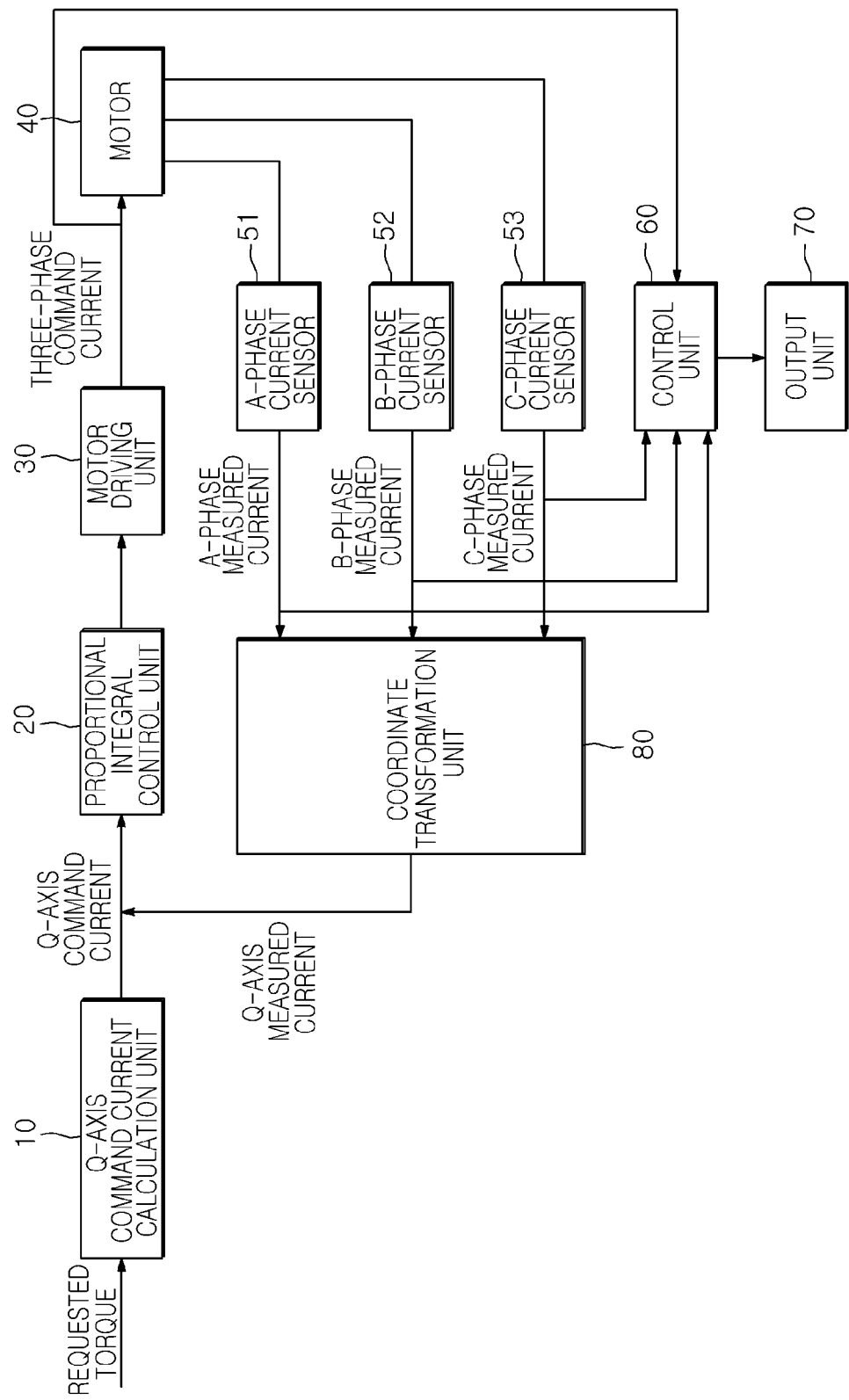

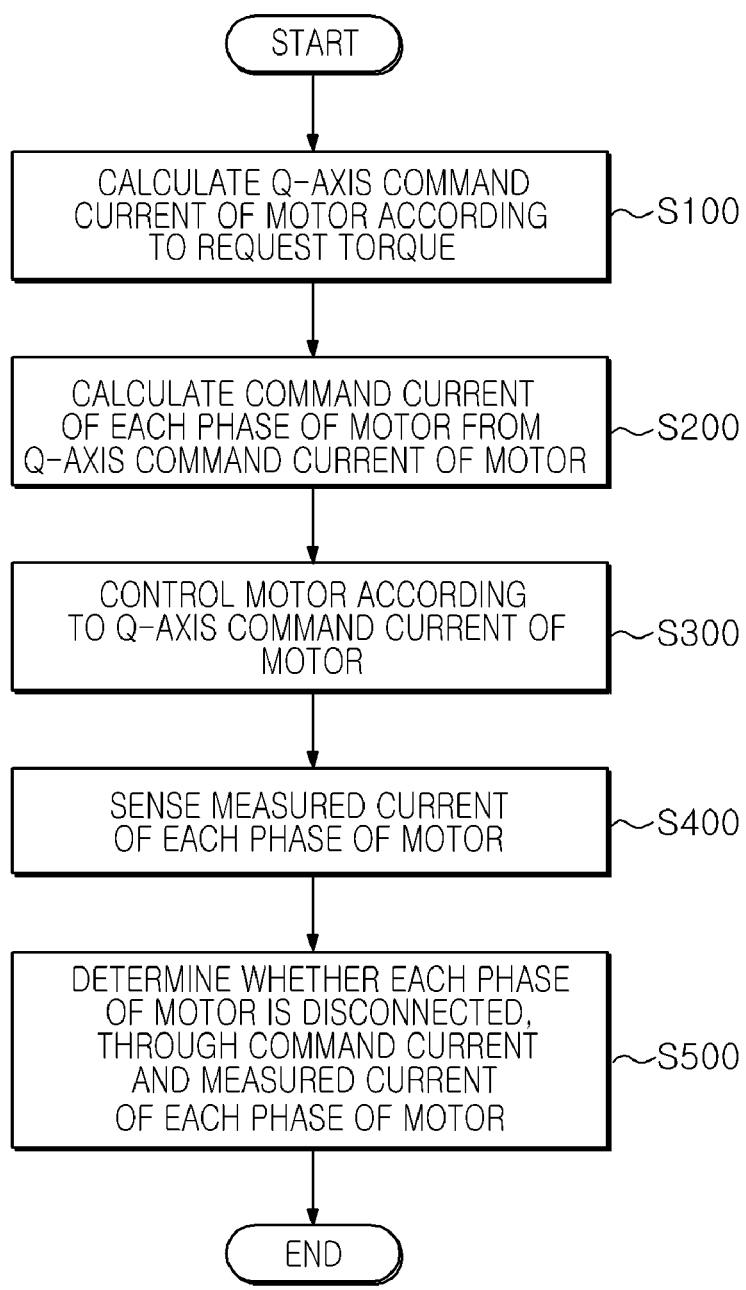

METHOD AND APPARATUS FOR DETECTING MOTOR ERROR OF MOTOR DRIVEN POWER STEERING

CROSS-REFERENCES TO RELATED APPLICATIONS

The present application claims priority to Korean application number 10-2013-0147161, filed on Nov. 29, 2013, which is incorporated by reference in its entirety.

BACKGROUND OF THE INVENTION

The present invention relates to a method and apparatus for detecting a motor error of a motor driven power steering (MDPS), and more particularly, to a method and apparatus for detecting a motor error of MDPS, which quickly detects disconnection of a line connected to each phase of a motor of the MDPS, thereby securing the safety of a driver.

Since MDPS generates an assist thrust through a motor, each upper logic calculates a proper command to generate steering torque.

That is, as illustrated in FIG. 1, when MDPS operating logic detects a motion of a steering wheel by a driver, a command calculated through steering performance logic is transmitted to torque limit logic to limit excessive torque, and steering torque is generated by a command calculated through motor control logic.

At this time, when a line connected to a phase of the motor is disconnected in the motor control logic, a current cannot flow through the corresponding phase. Thus, the MDPS does not normally operate, but fail-safe logic is driven.

Conventionally, in order to detect disconnection of each phase line of the motor, D-axis and Q-axis current errors of the motor have been used, steering wheel rotation speed and current variation ratio have been reflected, or a current of each phase has been sensed and checked.

In such a method, however, the disconnection was detected through the Q-axis command current of the motor. Thus, during high-speed traveling, the detection was impossible. Furthermore, since the steering wheel speed and current variation ratio are reflected to detect disconnection, the detection was impossible when the steering wheel is slowly operated, for example, when a vehicle is driven at low speed or stopped for a while. Thus, the method has limitation in detecting disconnection.

Furthermore, since the current of each phase of the motor has an 0 A value at a specific motor position, it is difficult to distinguish a normal situation from disconnection only through the Q-axis command current of the motor and the measured current of each phase of the motor.

The related art of the present invention is disclosed in Korean Patent Laid-open Publication No. 10-2012-0033171 published on Apr. 6, 2012 and entitled "Driving control method for electrical short in motor of motor driving power steering".

SUMMARY OF THE INVENTION

Embodiments of the present invention are directed to a method and apparatus for detecting a motor error of MDPS, which quickly detects disconnection of a line connected to each phase of a motor of the MDPS, thereby securing the safety of a driver.

In one embodiment, a method for detecting a motor error of MDPS may include: calculating, by a control unit, a Q-axis command current of a motor through a Q-axis command current calculation unit, according to requested torque; calculating a command current of each phase of the motor from the calculated Q-axis command current of the motor; controlling the motor according to the Q-axis command current of the motor, and sensing a measured current of each phase of the motor through each current sensor; determining whether each phase of the motor is disconnected, through the command current and the measured current of each phase of the motor; and outputting the determination result to an output unit.

The calculating of the command current of each phase of the motor may include calculating the command current of each phase of the motor through rotation coordinate transformation with respect to a Q-axis of the motor.

The determining of whether each phase of the motor is disconnected may include: increasing an error count, when the measured current is smaller than a preset measured current and the command current is larger than a preset command current; and determining that disconnection occurred, when the increased error count is larger than a preset count.

When the measured current is equal to or more than the preset measured current or the command current is equal to or less than the preset command current, the control unit may decrease the error count.

In another embodiment, an apparatus for detecting a motor error of MDPS may include: a Q-axis command current calculation unit configured to calculate a Q-axis command current of a motor according to requested torque; a motor driving unit configured to calculate a command current of each phase of the motor from the calculated Q-axis command current of the motor, and control the motor according to the Q-axis command current of the motor; a current sensor configured to sense a measured current of each phase of the motor; a control unit configured to determine whether each phase of the motor is disconnected, through the command current and the measured current of each phase of the motor; and an output unit configured to output the determination result of the control unit.

The motor driving unit may calculate the command current of each phase of the motor through rotation coordinate transformation with respect to the Q-axis of the motor.

The current sensor may sense the measured current of each phase of the motor, when the motor is controlled.

When the measured current is smaller than a preset measured current and the command current is larger than a preset command current, the control unit may increase an error count, and when the error count is larger than a preset count, the control unit may determine that disconnection occurred.

When the measured current is equal to or more than the preset measured current or the command current is equal to or less than the preset command current, the control unit may decrease the error count.

In accordance with the embodiments of the present invention, the method and apparatus for detecting a motor error of MDPS may quickly detect disconnection of a line connected to each phase of the motor of MDPS, thereby securing the safety of a driver.

Furthermore, the method and apparatus may detect disconnection of each phase of the motor through the measured current and the command current of the phase of the motor. Thus, since a combination of driving conditions such as vehicle speed and steering wheel rotation speed is not needed, the method and apparatus may detect an error at high speed, and detect motor phase disconnection regardless of driving conditions, thereby improving the error detection ability.

BRIEF DESCRIPTION OF THE DRAWINGS

FIG. 2 is a block configuration diagram illustrating an apparatus for detecting a motor error of MDPS in accordance with an embodiment of the present invention.

FIG. 4 is a flowchart illustrating a method for detecting a motor error of MDPS in accordance with an embodiment of the present invention.

DESCRIPTION OF SPECIFIC EMBODIMENTS

Figure 1:
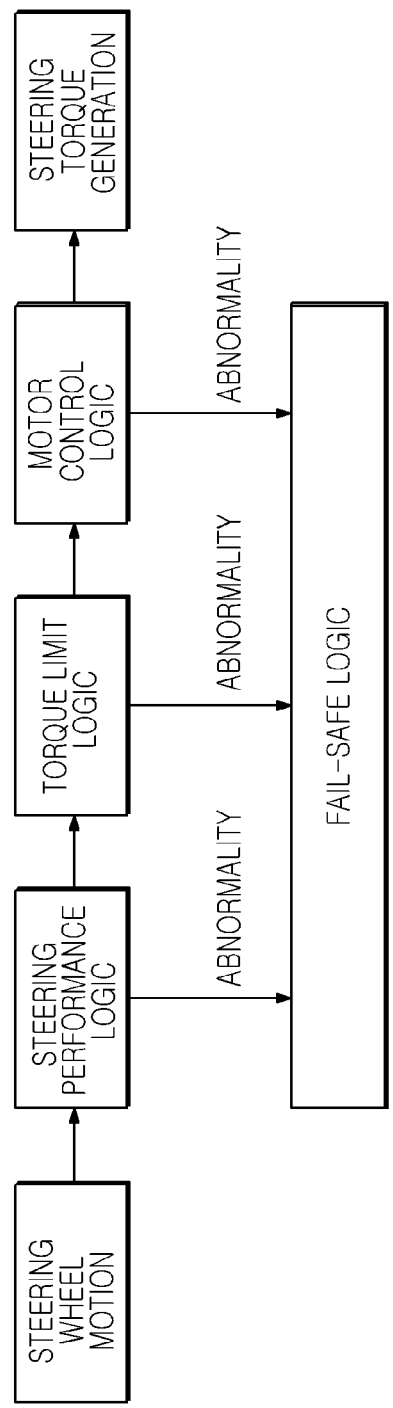
FIG. 1 briefly illustrates MDPS operating logic.

Embodiments of the invention will hereinafter be described in detail with reference to the accompanying drawings. It should be noted that the drawings are not to precise scale and may be exaggerated in thickness of lines or sizes of components for descriptive convenience and clarity only.

Furthermore, the terms as used herein are defined by taking functions of the invention into account and can be changed according to the custom or intention of users or operators. Therefore, definition of the terms should be made according to the overall disclosures set forth herein.

FIG. 2 is a block configuration diagram illustrating an apparatus for detecting a motor error of MDPS in accordance with an embodiment of the present invention.

As illustrated in FIG. 2, the apparatus for detecting a motor error of MDPS in accordance with the embodiment of the present invention may include a Q-axis command current calculation unit 10, a proportional-integral control unit 20, a motor driving unit 30, a motor 40, an A-phase current sensor 51, a B-phase current sensor 52, a C-phase current sensor 53, a control unit 60, an output unit 70, and a coordinate transformation unit 80.

The Q-axis command current calculation unit 10 may calculate a Q-axis command current of the motor 40 according to requested torque.

The proportional-integral control unit 20 may proportionally control the Q-axis command current of the motor 40, calculated through the Q-axis command current calculation unit 10, and integrate an error signal to output a motor control signal.

The motor driving unit 30 may calculate the PWM duty of the motor control signal outputted from the proportional-integral control unit 20, and calculate a command current of each phase of the motor 40.

The motor 40 may be driven according to the Q-axis command current.

At this time, the current sensors 51, 52, and 53 can be provided for the respective phases of the motor 40.

In the present embodiment, a three-phase motor is used as the motor 40. Thus, when the motor 40 is driven, an A-phase measured current, a B-phase measured current, and a C-phase measured current may be sensed through the A-phase current sensor 51, the B-phase current sensor 52, and the C-phase current sensor 53, respectively.

The control unit 60 may compare the command currents of the phases of the motor 40, calculated through the motor driving unit 30, to the A-phase, B-phase, and C-phase measured currents, respectively, and determine whether disconnection occurred in the respective phases of the motor 40.

The A phase of the motor 40 may be taken as an example for description. The control unit 60 may determine whether the A-phase measured current of the motor 40 is equal to or more than a preset measured current. When the A-phase measured current of the motor 40 is less than the preset measured current, the control unit 60 may determine whether the A-phase command current of the motor 40 has a larger value than a preset command current. When the A-phase command current of the motor 40 has a larger value than the preset command current, the control unit 60 may increase an error count.

At this time, only when the two conditions are satisfied, the control unit 60 may increase the error count, and when any one of the two conditions is not satisfied, the control unit 60 may decrease the error count.

Only when the error count increased in such a manner is greater than a preset count, the control unit 60 may determine that the A-phase of the motor 40 is disconnected.

The control unit 60 may determine disconnection of the B-phase and C-phase of the motor 40 in the same manner.

That is, when a phase of the motor 40 is disconnected, no current can flow through the corresponding phase. Thus, since a measured current for the corresponding phase is likely to become near zero, the control unit 60 may determine whether the measured current is smaller than the preset measured current.

At this time, the preset measured current may be set to a near-zero value. The reason is that, since the preset measured current is not exactly zero, the preset measured current may be set to a near-zero value. When the measured current falls within the range of the preset measured current, the control unit 60 may determine that disconnection occurred.

In order to control the motor 40, D-axis and Q-axis command currents of the motor 40 may be calculated. These values may be used to calculate the command currents of the respective phases (A-phase, B-phase, and C-phase) of the motor 40 through D-Q rotation coordinate transformation.

At this time, when the motor 40 is rotated, the measured current of each phase shows a sine wave pattern, and passes through the near-zero region at all times. Thus, when the measured current is near zero, it may not necessarily indicate that disconnection occurred. Therefore, in the present embodiment, when a command current of a phase of the motor 40 has a larger value than the preset command current and a measured current is near zero, the control unit 60 may determine that the phase was disconnected.

The output unit 70 may output the phase of the motor 40, which was determined to be disconnected.

The coordinate transformation unit 80 may calculate a Q-axis measured current of the motor 40 through the rotation coordinate transformation for the D-axis and Q-axis of the motor 40, using the A-phase measured current, the B-phase measured current, and the C-phase measured current. The calculated Q-axis measured current of the motor 40 may be reflected when the Q-axis command current calculation unit 10 calculates the Q-axis command current of the motor 40.

FIGS. 3A to 3D illustrate the process of detecting disconnection of motor phase in the apparatus for detecting a motor error of MDPS in accordance with the embodiment of the present invention.

Figure 3A:
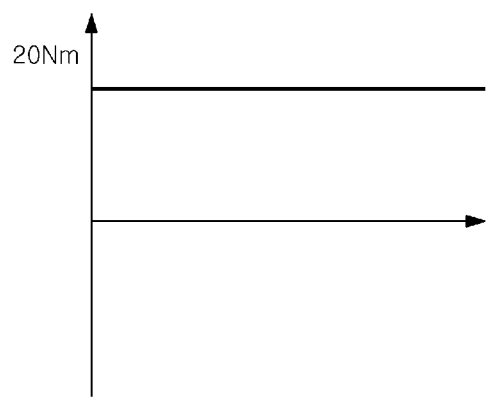
FIGS. 3A to 3D illustrate a process of detecting disconnection of motor phase in the apparatus for detecting a motor error of MDPS in accordance with the embodiment of the present invention.
Figure 3B:
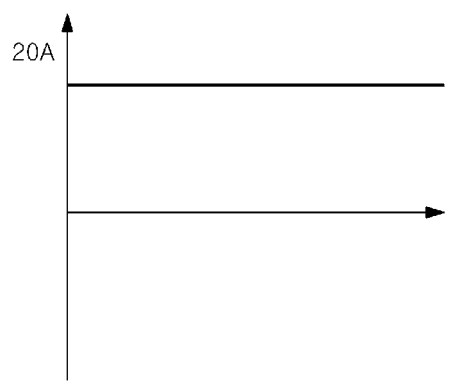
Figure 3C:
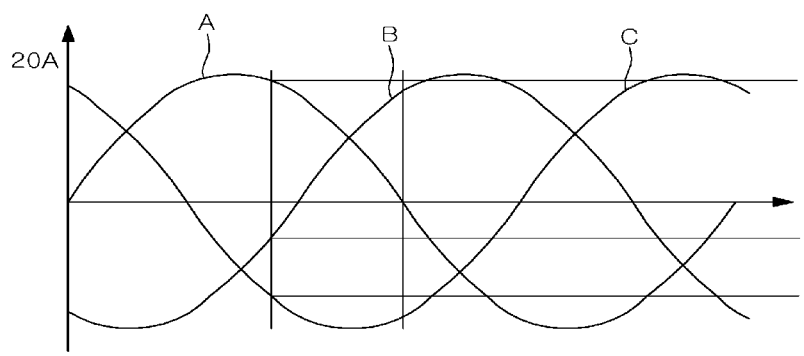

FIG. 3A is a graph illustrating requested torque. According to the requested torque, the Q-axis command current calculation unit 10 may calculate a Q-axis command current of the motor 40 by multiplying the Q-axis current of the motor 40 by a constant, and the Q-axis command current is illustrated in FIG. 3B. Then, the motor driving unit 30 may calculate a three-phase command current to drive the motor 40 as illustrated in FIG. 3C. At this time, graphs A, B, and C of FIG. 3C illustrate command currents of the A-phase, the B-phase, and the C-phase, respectively.

Figure 3D:
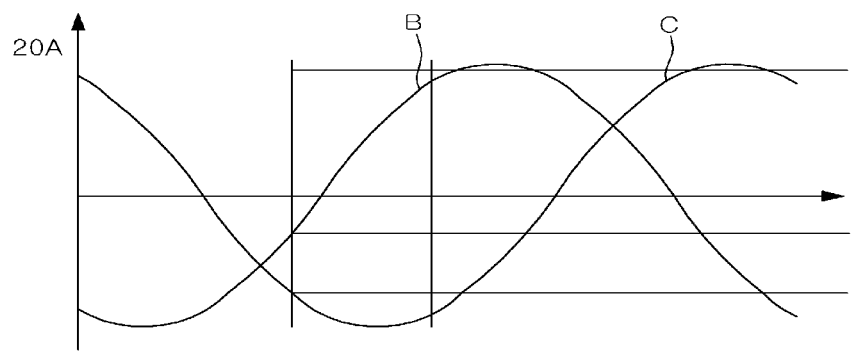

FIG. 3D illustrates an A-phase measured current, a B-phase measured current, and a C-phase measured current which are sensed through the A-phase current sensor 51, the B-phase current sensor 52, and the C-phase current sensor 53, respectively. In FIG. 3D, only the graphs B and C are detected, which indicates that the line of the A-phase of the motor 40 was disconnected.

As described above, the apparatus for detecting a motor error of MDPS in accordance with the embodiment of the present invention may quickly detect disconnection of a line connected to each phase of the motor of MDPS, thereby securing the safety of a driver.

Furthermore, the apparatus may detect disconnection of each phase of the motor through the measured current and the command current of the phase of the motor. Thus, since a combination of driving conditions such as vehicle speed and steering wheel rotation speed is not needed, the apparatus may detect an error at high speed, and detect motor phase disconnection regardless of driving conditions, thereby improving the error detection ability.

FIG. 4 is a flowchart illustrating a method for detecting a motor error of MDPS in accordance with an embodiment of the present invention. Referring to FIG. 4, the method for detecting a motor error of MDSP in accordance with the embodiment of the present invention will be described in detail.

First, the control unit 60 may calculate a Q-axis command current of the motor 40 according to requested torque, at step S100.

More specifically, the Q-axis command current calculation unit 10 may calculate the Q-axis command current of the motor 40 according to the requested torque.

The control unit 60 may calculate a command current of each phase of the motor 40 from the Q-axis command current of the motor 40, calculated at step S100, at step S200.

At this time, the command current of each phase of the motor 40 may be calculated through rotation coordinate transformation between the Q-axis and the D-axis of the motor 40.

More specifically, the proportional-integral control unit 20 may proportionally control the Q-axis command current of the motor 40, calculated through the Q-axis command current calculation unit 10, and integrate an error signal to output a motor control signal. The motor driving unit 30 may calculate the PWM duty of the motor control signal outputted from the proportional-integral control unit 20 so as to calculate the command current of each phase of the motor 40.

Next, the control unit 60 may control the motor 40 according to the Q-axis command current of the motor 40, at step S300.

At this time, measured currents of the respective phases of the motor 40 may be sensed through the current sensors 51, 52, and 53 of the respective phases of the motor 40, at step S400.

In the present embodiment, a three-phase motor is used as the motor 40. Thus, when the motor 40 is driven, an A-phase measured current, a B-phase measured current, and a C-phase measured current may be sensed through the A-phase current sensor 51, the B-phase current sensor 52, and the C-phase current sensor 53, respectively.

The control unit 60 may compare the command currents of the respective phases of the motor 40, calculated through the motor driving unit 30, to the measured currents of the respective phases, determine whether the respective phases of the motor 40 are disconnected, and output the determination results to the output unit 70, at step S500.

Figure 5:
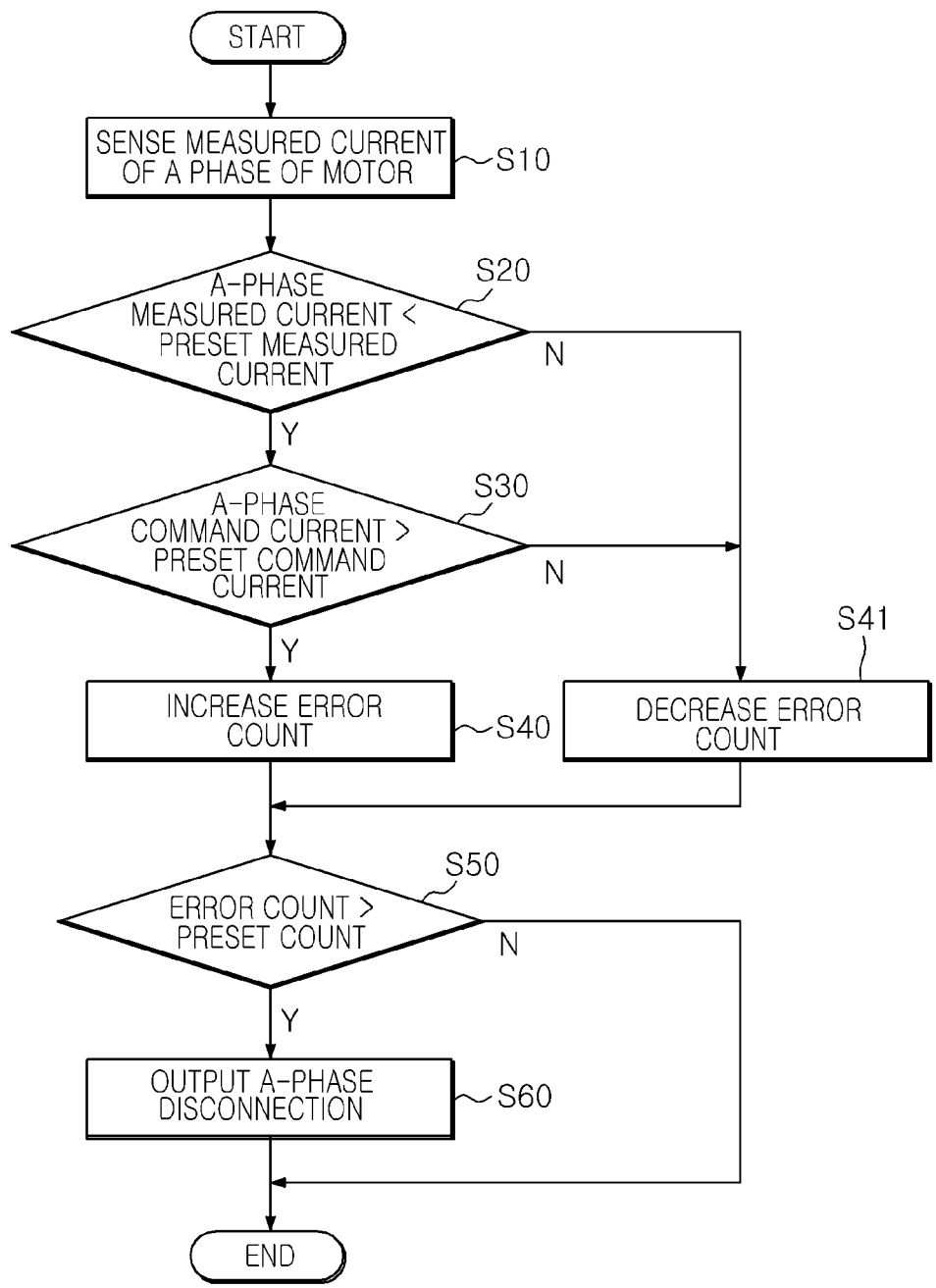
FIG. 5 is a flowchart illustrating a process of detecting disconnection of A phase of a motor in the method for detecting a motor error of MDPS in accordance with the embodiment of the present invention.

FIG. 5 is a flowchart illustrating a process of detecting disconnection of the A phase of the motor in the method for detecting a motor error of MDPS in accordance with the embodiment of the present invention.

Referring to FIG. 5, the A phase of the motor 40 will be described. First, the measured current of the A phase of the motor 40 may be sensed at step S10.

The measured current of the A phase of the motor 40, sensed at step S10, may be compared to a preset measured current at step S20.

When the measured current of the A phase of the motor 40 is less than the preset measured current, a command current of the A phase of the motor 40 may be compared to a preset command current at step S30.

When the command current of the A phase of the motor 40 is larger than the preset command current, the control unit 60 may increase an error count at step S40.

That is, only when both of steps S20 and S30 are satisfied, the control unit 60 may increase the error count, and when any one of steps S20 and S30 is not satisfied, the control unit 60 may decrease the error count, at step S41.

The control unit 60 may determine whether the increased error count is larger than a preset count, at step S50.

When it is determined at step S50 that the error count is larger than the preset count, the control unit 60 may output disconnection of the A phase of the motor 40 through the output unit 70 at step S60.

The disconnection of the B phase and the C phase of the motor 40 may be determined in the same manner.

That is, when a phase of the motor 40 is disconnected, no current can flow through the corresponding phase, and a measured current may become near zero. Thus, the control unit 60 may determine whether the measured current is smaller than the preset measured current.

At this time, the preset measured current may be set to a near-zero value. The reason is that, since the preset measured current is not exactly zero, the preset measured current may be set to a near-zero value. When the measured current falls within the range of the preset measured current, the control unit 60 may determine that disconnection occurred.

Furthermore, in order to control the motor 40, D-axis and Q-axis command currents of the motor 40 may be calculated. These values may be used to calculate the command currents of the respective phases (A-phase, B-phase, and C-phase) of the motor 40 through D-Q rotation coordinate transformation.

At this time, when the motor 40 is rotated, the measured current of each phase shows a sine wave pattern, and passes through the near-zero region at all times. Thus, when the measured current is near zero, it may not necessarily indicate that disconnection occurred. Therefore, in the present embodiment, when a command current of a phase of the motor 40 has a larger value than the preset command current and a measured current is near zero, the control unit 60 may determine that the phase was disconnected.

As described above, the method for detecting a motor error of MDPS in accordance with the embodiment of the present invention may quickly detect disconnection of a line connected to each phase of the motor of MDPS, thereby securing the safety of a driver.

Furthermore, the method may detect disconnection of each phase of the motor through the measured current and the command current of the phase of the motor. Thus, since a combination of driving conditions such as vehicle speed and steering wheel rotation speed is not needed, the method may detect an error at high speed, and detect motor phase disconnection regardless of driving conditions, thereby improving the error detection ability.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A method for detecting a motor error of a motor driven power steering (MDPS) comprising a three-phase AC motor, the method comprising:
    detecting a current at a first one of three-phase AC motor;
    calculating, by a control unit, a Q-axis command current corresponding to requested torque for steering at least one wheel;
    computing a phase command current of the first phase of the motor based on the Q-axis command current;
    comparing the detected current against a first predetermined reference value;
    comparing the phase command current against a second predetermined reference value;
    increasing an error count for the first phase of the motor when the detected current is smaller than the first predetermined reference value and the phase command current is greater than the second predetermined reference value;
    decreasing the error count for the first phase of the motor when the detected current is greater than the first predetermined reference value or when the detected current is smaller than the first predetermined reference value and the phase command current is smaller than the second predetermined reference value;
    determining that the first phase has a problem when the error count is greater than a third predetermined reference value.

2. A method for detecting a motor error, of a motor driven power steering (MDPS), comprising:
    calculating, by a control unit, a Q-axis command current of a motor through a Q-axis command current calculation unit, according to requested torque;
    calculating a command current of each phase of the motor from the calculated Q-axis command current of the motor;
    controlling the motor according to the Q-axis command current of the motor, and sensing a measured current of each phase of the motor through each current sensor; and
    determining whether each phase of the motor is disconnected, through the command current and the measured current of each phase of the motor,
    wherein determining whether each phase of the motor is disconnected comprises:
    increasing an error count, when the measured current is smaller than a preset measured current and the command current is larger than a preset command current; and
    determining that disconnection occurred, when the increased error count is larger than a preset count.

3. The method of claim 2, wherein when the measured current is equal to or more than the preset measured current or the command current is equal to or less than the preset command current, the control unit decreases the error count.

4. An apparatus for detecting a motor error of MDPS using an operating logic stored in a memory, the apparatus comprising:
    a Q-axis command current calculation unit configured to calculate a Q-axis command current of a motor according to requested torque;
    a motor driving unit configured to calculate a command current of each phase of the motor from the calculated Q-axis command current of the motor, and control the motor according to the Q-axis command current of the motor;
    a current sensor configured to sense a measured current of each phase of the motor; and
    a control unit configured to determine whether each phase of the motor is disconnected, through the command current and the measured current of each phase of the motor;
    wherein when the measured current is smaller than a preset measured current and the command current is larger than a preset command current, the control unit is configured to increase an error count, wherein when the error count is larger than a preset count, the control unit is configured to determine that disconnection occurred.

5. The apparatus of claim 4, wherein the motor driving unit calculates the command current of each phase of the motor through rotation coordinate transformation with respect to the Q-axis of the motor.

6. The apparatus of claim 4, wherein when the measured current is equal to or more than the preset measured current or the command current is equal to or less than the preset command current, the control unit decreases the error count.

7. The method of claim 2, wherein the calculating of the command current of each phase of the motor comprises calculating the command current of each phase of the motor through rotation coordinate transformation with respect to a Q-axis of the motor.

* * * * *